(12) United States Patent
Morita (10) Patent No.: US 11,404,377 B2
(45) Date of Patent: Aug. 2, 2022

(54) SEMICONDUCTOR DEVICE AND MANUFACTURING METHOD THEREOF

(71) Applicant: Kioxia Corporation, Tokyo (JP)

(72) Inventor: Toshiyuki Morita, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 37 days.

(21) Appl. No.: 17/019,711

(22) Filed: Sep. 14, 2020

(65) Prior Publication Data

US 2021/0280526 A1    Sep. 9, 2021

(30) Foreign Application Priority Data

Mar. 6, 2020  (JP) .............................. JP2020-039125

(51) Int. Cl.

| | | |
|---|---|---|
| H01L 23/532 | (2006.01) | |
| H01L 27/11524 | (2017.01) | |
| H01L 27/11556 | (2017.01) | |
| H01L 27/1157 | (2017.01) | |
| H01L 23/522 | (2006.01) | |
| H01L 27/11529 | (2017.01) | |
| H01L 27/11573 | (2017.01) | |
| H01L 21/768 | (2006.01) | |
| H01L 27/11582 | (2017.01) | |

(52) U.S. Cl.
CPC .. *H01L 23/53266* (2013.01); *H01L 21/76843* (2013.01); *H01L 23/5226* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ......... H01L 23/53266; H01L 21/76843; H01L 23/5226; H01L 27/11524; H01L 27/11529; H01L 27/11556; H01L 27/1157; H01L 27/11573; H01L 27/11582
See application file for complete search history.

(56) References Cited

U.S. PATENT DOCUMENTS

| | | | |
|---|---|---|---|
| 5,834,846 A | 11/1998 | Shinriki et al. | |
| 6,767,796 B2 | 7/2004 | Tanaka et al. | |
| 2009/0065844 A1* | 3/2009 | Iinuma | H01L 27/11524 |
| | | | 257/316 |

FOREIGN PATENT DOCUMENTS

| | | |
|---|---|---|
| JP | 2-199826 A | 8/1990 |
| JP | 8-191054 A | 7/1996 |
| JP | 2002-118078 A | 4/2002 |
| JP | 5832715 B2 | 12/2015 |

\* cited by examiner

*Primary Examiner* — Karen Kusumakar
(74) *Attorney, Agent, or Firm* — Oblon, McClelland, Maier & Neustadt, L.L.P.

(57) ABSTRACT

A semiconductor device according to an embodiment includes: a semiconductor substrate having a diffusion region including an impurity; and a contact provided on the diffusion region. The contact includes a metal film, a barrier metal film covering the metal film, and a conductive film provided between the barrier metal film and the diffusion region and including a conductive material having a higher heat of formation than a heat of formation of the barrier metal film.

9 Claims, 9 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2020-039125, filed on Mar. 6, 2020; the entire contents of which are incorporated herein by reference.

FIELD

Embodiments of the present invention relate to a semiconductor device and a manufacturing method thereof.

BACKGROUND

In a semiconductor device having memory cells in a three-dimensional structure, a peripheral circuit having transistors which drive the memory cells and the like is formed. Furthermore, in the peripheral circuit, contacts are formed for connecting diffusion layers (drain layers and source layers) of the transistors to wiring.

The contacts typically have a structure in which a metal film is covered by a barrier metal film, and there can be a case where they are produced prior to the memory cells. In this case, since the memory cells are produced under high temperature conditions, the contacts are heated.

DETAILED DESCRIPTION

Embodiments will now be explained with reference to the accompanying drawings. The present invention is not limited to the embodiments.

A semiconductor device according to an embodiment includes: a semiconductor substrate having a diffusion region including an impurity; and a contact provided on the diffusion region. The contact includes a metal film, a barrier metal film covering the metal film, and a conductive film provided between the barrier metal film and the diffusion region and including a conductive material having a higher heat of formation than a heat of formation of the barrier metal film.

First Embodiment

Figure 1:
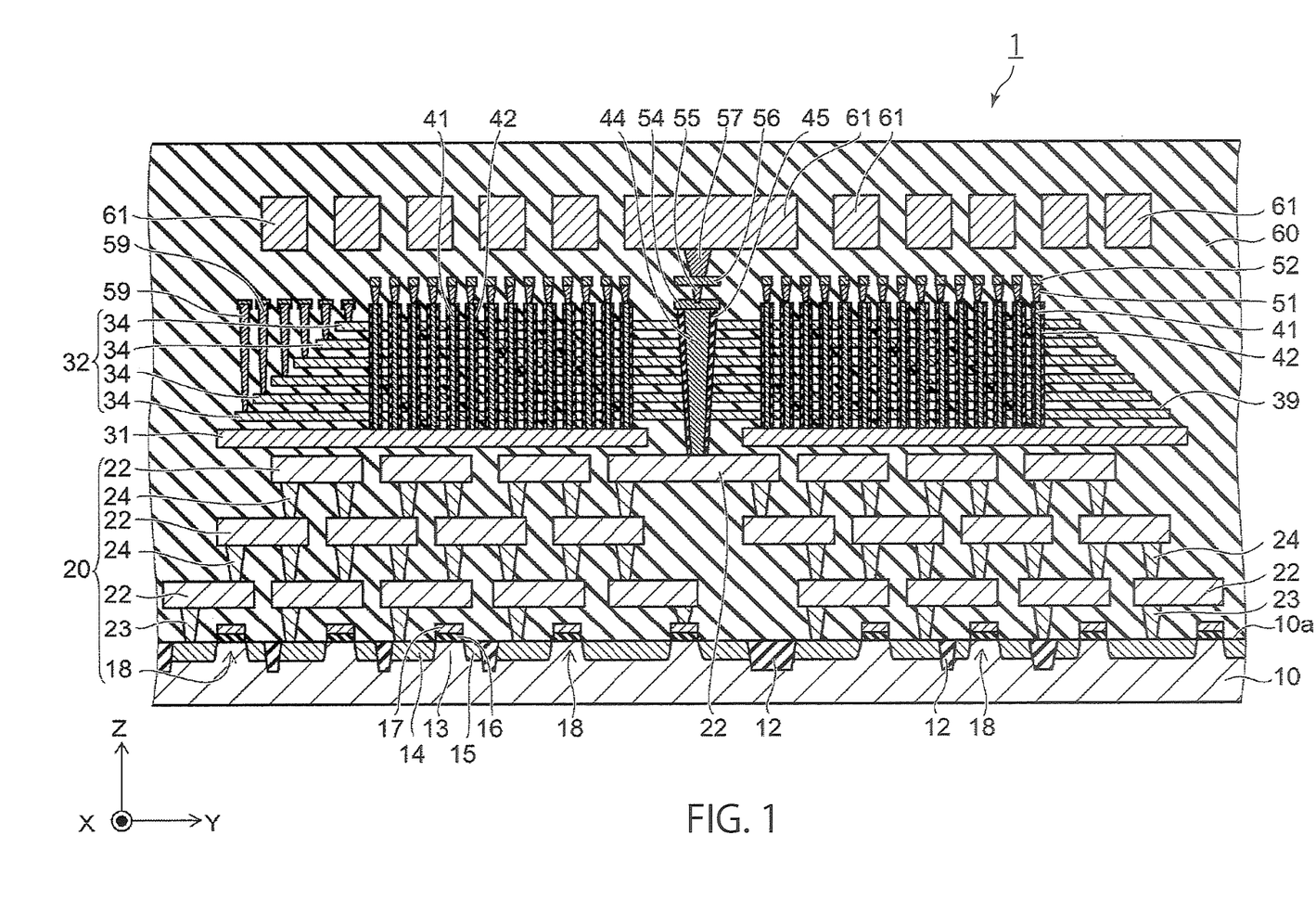
FIG. 1 is a cross sectional view showing a structure of a semiconductor device according to a first embodiment.

FIG. 1 is a cross sectional view showing a structure of a semiconductor device according to a first embodiment. A semiconductor device 1 according to the present embodiment is a NAND nonvolatile semiconductor storage device which has memory cells in a three-dimensional structure, can freely electrically erase and write data, and can hold the contents of memory even after power supply is turned off.

The semiconductor device 1 shown in FIG. 1 includes a semiconductor substrate 10, a peripheral circuit 20 and a stacked body 32. In the following description, two directions which are parallel to the semiconductor substrate 10 and perpendicular to each other are regarded as an X-direction and a Y-direction. Moreover, the direction which is perpendicular to the semiconductor substrate 10, being perpendicular to the X-direction and the Y-direction, is regarded as a Z-direction. The Z-direction is a stacking direction of the stacked body 32 too.

The semiconductor substrate 10 is exemplarily a silicon substrate. STIs (Shallow Trench Isolations: isolation insulators) 12 are selectively provided in an upper portion of the semiconductor substrate 10. The STIs 12 divide the upper portion of the semiconductor substrate 10 into a plurality of semiconductor regions 13. In at least part of the semiconductor regions 13, source layers 14 and drain layers 15 are formed. Each of the source layers 14 and the drain layers 15 is exemplarily a diffusion region including boron (B) as an impurity.

A gate insulating film 16 and a gate electrode 17 are provided in the semiconductor region 13. The gate insulating film 16, the gate electrode 17, the source layer 14 and the drain layer 15 form a field-effect transistor 18.

An interlayer insulating film 60 exemplarily including silicon oxide ($Si_2O_3$) is provided on the semiconductor substrate 10. A plurality of layers of wiring 22 are provided in the interlayer insulating film 60. A plurality of contacts 23 connect the semiconductor substrate 10 and the lowermost layer of wiring 22 therebetween. Each contact 23 is in contact with the source layer 14 or the drain layer 15. A structure of the contact 23 is herein described with reference to FIG. 2.

Figure 2:
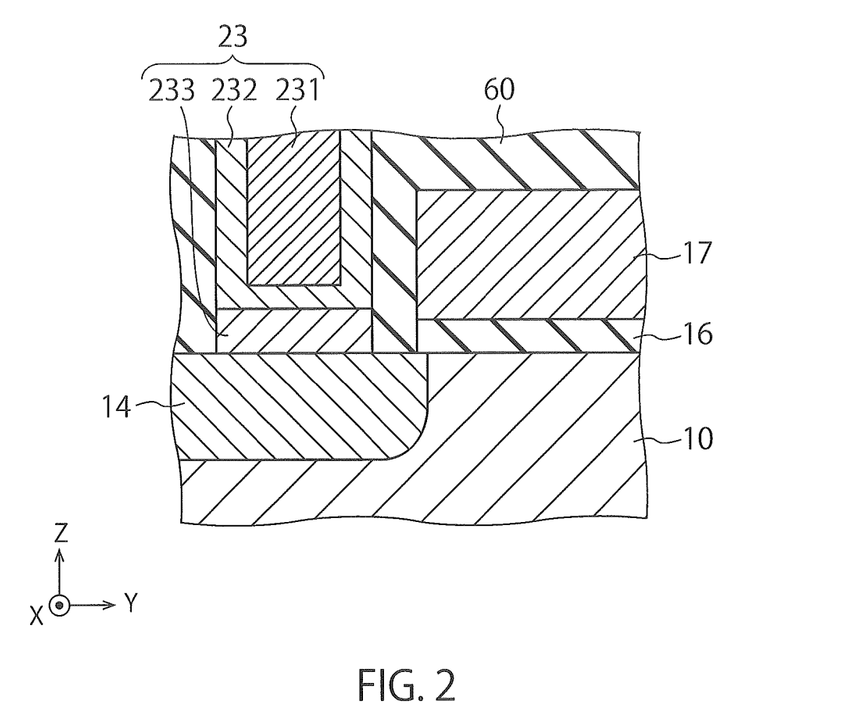
FIG. 2 is a cross sectional view having a part of a contact expanded.

FIG. 2 is a cross sectional view having a part of the contact 23 expanded. As shown in FIG. 2, the contact 23 has a metal film 231, a barrier metal film 232 and a conductive film 233.

The metal film 231 exemplarily includes tungsten (W). The barrier metal film 232 exemplarily includes titanium nitride (TiN) and covers a lateral surface and a bottom surface of the metal film 231. The conductive film 233 is provided between a bottom surface of the barrier metal film 232 and the source layer 14 (or the drain layer 15).

The conductive film 233 is composed of a conductive material having a higher heat of formation than a heat of formation of the barrier metal film 232. A material of the barrier metal film 232 can be titanium nitride as above, the heat of formation of which is 338.1 [kJ/mol]. Therefore, in this case, the conductive material having a heat of formation higher than 338.1 [kJ/mol] such as zirconium nitride (ZrN) or hafnium nitride (HfN) is exemplarily used for the conductive film 233. The heat of formation of zirconium nitride is 364.8 [kJ/mol]. The heat of formation of hafnium nitride is 369.3 [kJ/mol].

As shown in FIG. 1, the contacts 23 configured as above are connected to vias 24 via the lowermost layer of wiring 22. The peripheral circuit 20 is formed of the transistors 18, the wiring 22, the contacts 23 and the vias 24. The peripheral circuit 20 is exemplarily a sense amplifier.

A buried source line 31 is provided on the uppermost layer of wiring 22. Voltages are supplied to portions of the buried source line 31 from the peripheral circuit 20. The stacked body 32 is provided on the buried source line 31.

Channels 41 extend in the Z-direction in the stacked body 32. The channels 41 exemplarily include polysilicon and each of them has a cylindrical shape, the lower end part of which is closed. The channels 41 are connected to bit lines 52 extending in the X-direction via plugs 51.

Moreover, a through via 44 extending in the Z-direction is provided in the stacked body 32. A lower end of the through via 44 is connected to the uppermost layer of wiring 22 in the peripheral circuit 20. The through via 44 is insulated from electrode films 34 by an insulating film 45.

On and above the through via 44, intermediate wiring 54, a plug 55, intermediate wiring 56 and a plug 57 are provided. Upper wiring 61 is provided on the plug 57. The through via 44 is connected to the upper wiring 61 via the intermediate wiring 54, the plug 55, the intermediate wiring 56 and the plug 57. A power supply potential or a signal potential is applied to the peripheral circuit 20 via the upper wiring 61 and the through via 44.

The buried source line 31, the stacked body 32, the plug 51, the bit lines 52, the intermediate wiring 54, the plug 55, the intermediate wiring 56, the plug 57, contacts 59 and the upper wiring 61 are embedded in the interlayer insulating film 60.

Figure 3:
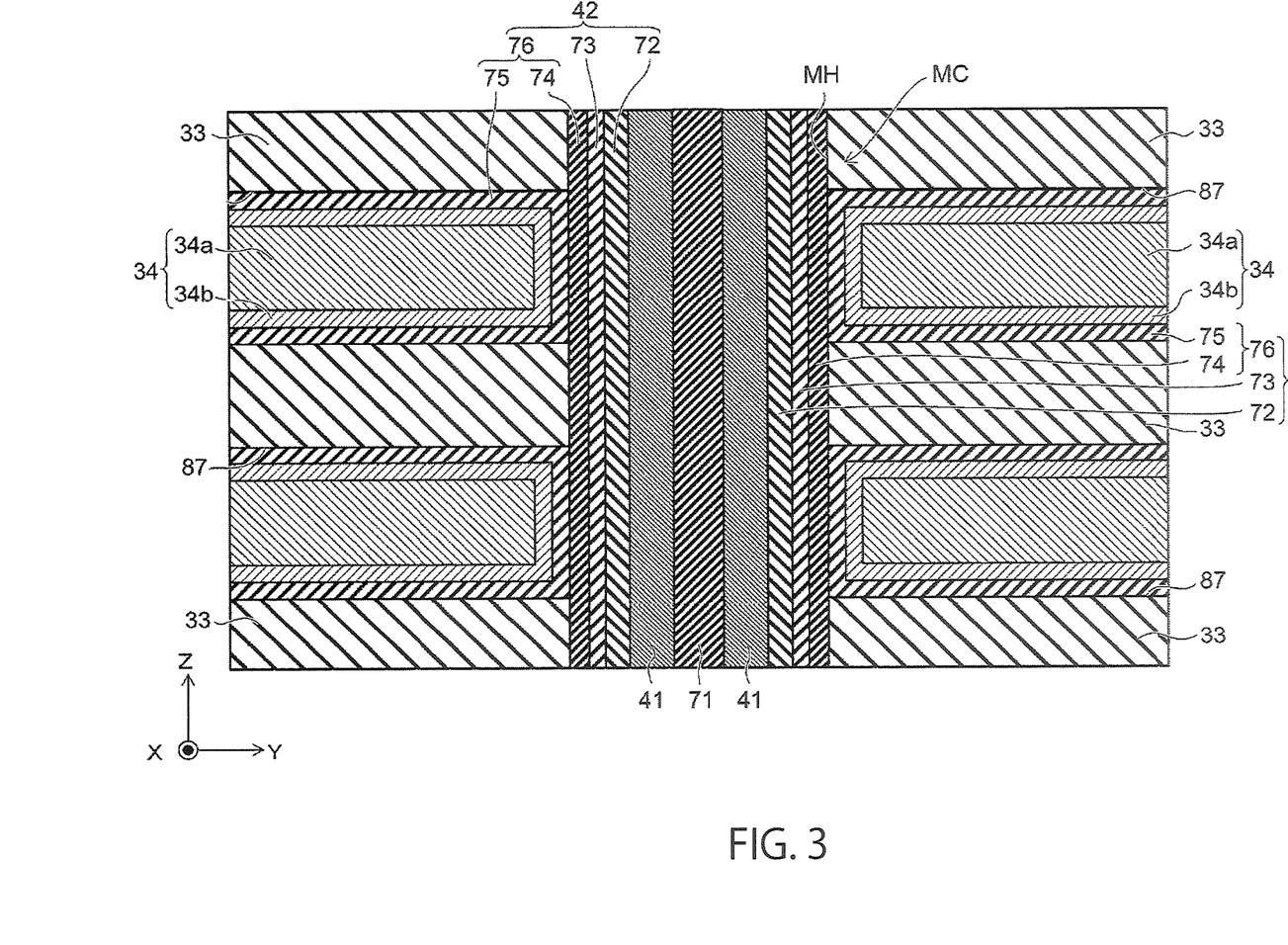
FIG. 3 is a cross sectional view showing an internal structure of a stacked body.

FIG. 3 is a cross sectional view showing an internal structure of the stacked body 32. A plurality of insulating films 33 and the electrode films 34 are alternately stacked along the Z-direction in the stacked body 32. The insulating films 33 exemplarily include silicon oxide. Each electrode film 34 has a main part 34a exemplarily including tungsten and a barrier metal layer 34b exemplarily including titanium nitride. The barrier metal layer 34b covers the upper surface and the lower surface of the main part 34a and a lateral surface thereof facing the channel 41. A part of the electrode films 34 function as word lines.

Memory films 42 are provided between the electrode films 34 and the channels 41. Moreover, in each cylindrical channel 41, a core member 71 exemplarily including silicon oxide is provided. Each memory film 42 is formed of a tunnel insulating film 72, a charge storage capacitor 73 and a block insulating film 76. The intersection of the electrode film 34 functioning a word line and the memory film 42 is a memory cell.

The tunnel insulating film 72 is provided on the lateral surface of the channel 41. The tunnel insulating film 72 exemplarily includes silicon oxide. The charge storage capacitor 73 in a cylindrical shape is provided on the lateral surface of the tunnel insulating film 72. The charge storage capacitor 73 exemplarily includes silicon nitride. A low dielectric constant layer 74 is provided on the lateral surface of the charge storage capacitor 73. The low dielectric constant layer 74 exemplarily includes silicon oxide.

Moreover, a high dielectric constant layer 75 is provided on the upper surface and the lower surface of the electrode film 34 and the lateral surface thereof facing the channel 41. The high dielectric constant layer 75 includes a material having a higher specific dielectric constant than a specific dielectric constant of silicon oxide, such as aluminum oxide ($Al_2O_3$). The low dielectric constant layer 74 and the high dielectric constant layer 75 form the block insulating film 76.

Hereafter, a manufacturing method of the semiconductor device according to the present embodiment is described with reference to FIG. 4 to FIG. 7. Notably, a process of manufacturing the contact 23 described with FIG. 2 is herein described.

Figure 4:
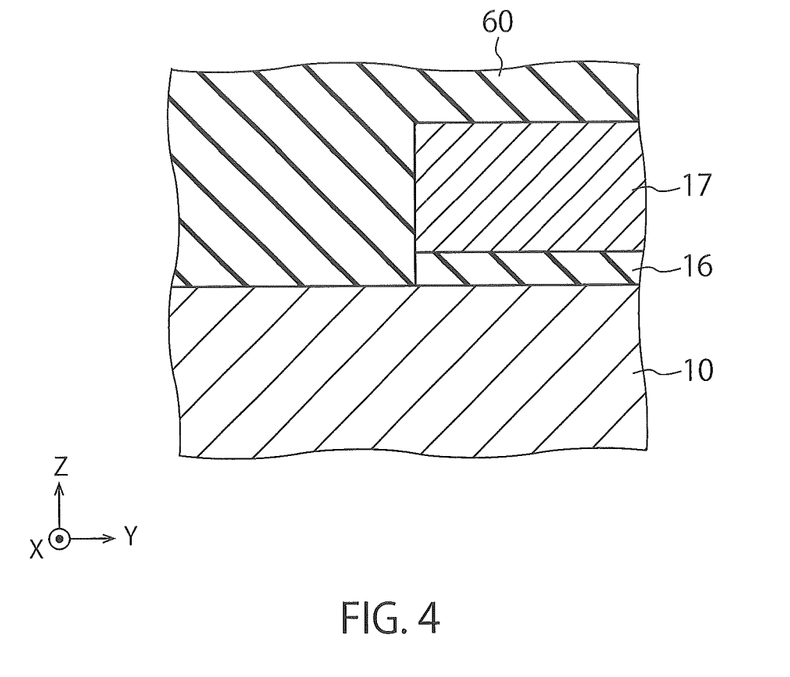
FIG. 4 is a cross sectional view showing a step of forming a gate insulating film, a gate electrode and an interlayer insulating film on a semiconductor substrate.

First, as shown in FIG. 4, the gate insulating film 16 and the gate electrode 17 are formed on the semiconductor substrate 10, and subsequently, the interlayer insulating film 60 is formed to cover the semiconductor substrate 10. The gate insulating film 16 can be formed, for example, of silicon oxide. Moreover, the gate electrode 17 can be formed, for example, of polysilicon.

Figure 5:
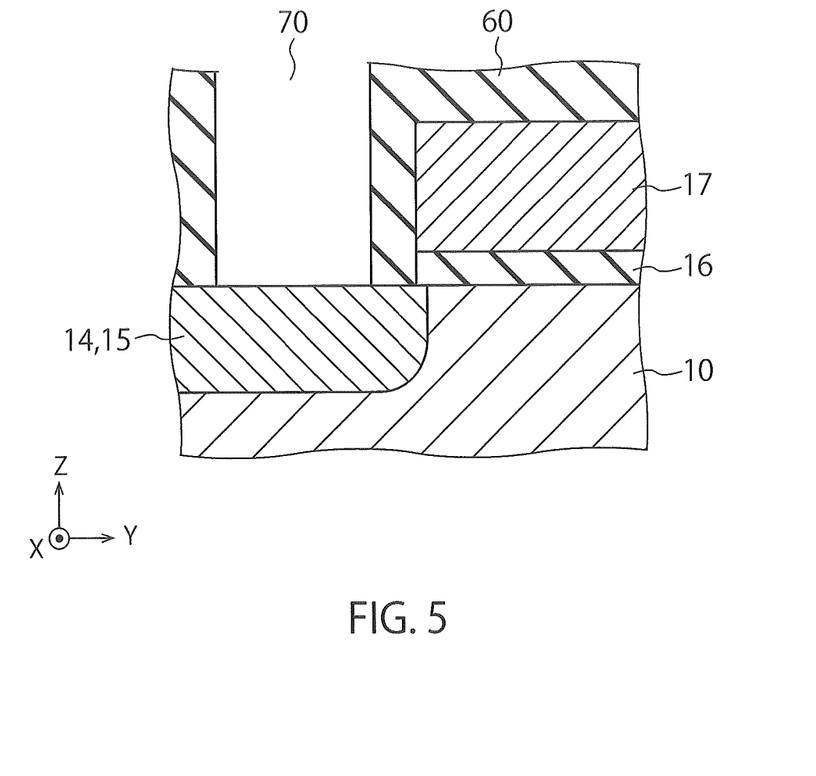
FIG. 5 is a cross sectional view showing a step of forming a hole in the interlayer insulating film.

Next, as shown in FIG. 5, a hole 70 penetrating the interlayer insulating film 60 in the Z-direction is formed. The hole 70 can be formed, for example, by RIE (Reactive Ion Etching). Subsequently, an impurity is implanted and caused to diffuse into the semiconductor substrate 10 from above the hole 70. In the present embodiment, boron is implanted. Thereby, the source layer 14 and the drain layer 15 of P-type are formed at the surface of the semiconductor substrate 10.

Figure 6:
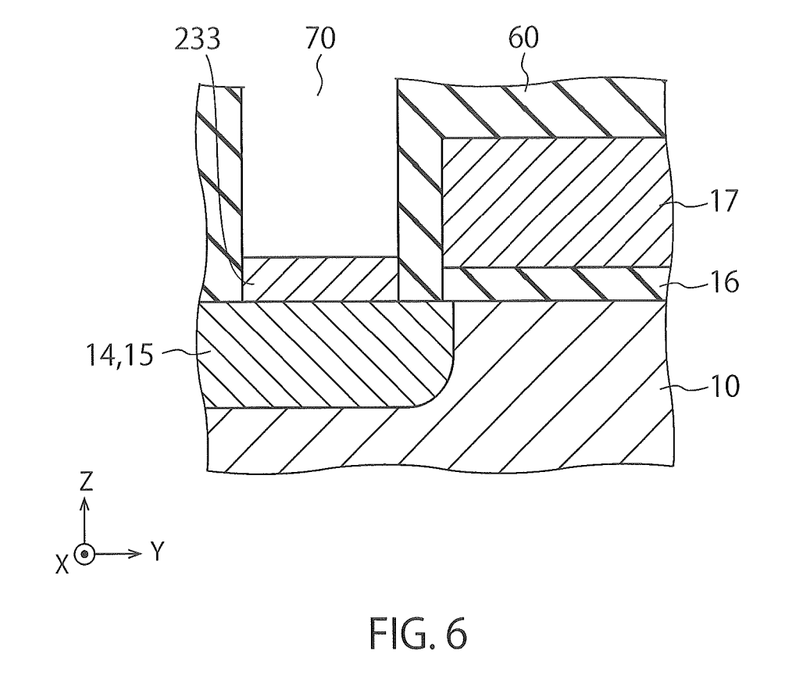
FIG. 6 is a cross sectional view showing a step of forming a conductive film.

Next, as shown in FIG. 6, the conductive film 233 is formed on the bottom part of the hole 70. In the present embodiment, the conductive film 233 is formed by sputtering. Thereby, the conductive film 233 is formed on each of the source layer 14 and the drain layer 15.

Figure 7:
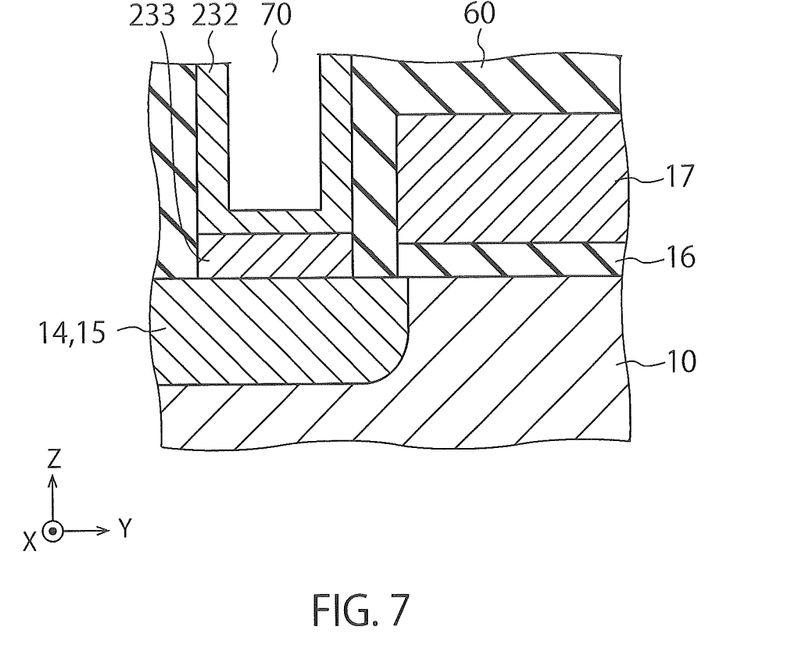
FIG. 7 is a cross sectional view showing a step of forming a barrier metal film.

Next, as shown in FIG. 7, the barrier metal film 232 is formed on the upper surface of the conductive film 233 and the lateral surface of the hole 70. The barrier metal film 232 can be formed, for example, by CVD (Chemical Vapor Deposition) or ALD (Atomic Layer Deposition).

In the end, as shown in FIG. 2, the metal film 231 is formed on the barrier metal film 232, which completes the contact 23. The metal film 231 can be formed by embedding metal such as tungsten in the hole 70.

After that, the stacked body 32, memory films 42 and the like mentioned above, are formed on the contacts 23. The stacked body 32 and the memory films 42 are formed by ordinarily used methods and their detailed description is omitted. The contacts 23 are heated since in such ordinary methods, the stacked body 32 and the memory films 42 are formed under high temperature conditions. Supposing that the crystal structure of the barrier metal film 232 collapses under such conditions, there arises a concern that the impurity (boron in the present embodiment) included in the source layer 14 and the drain layer 15 would diffuse into the metal film 231 through the barrier metal film 232, which raises the resistance of the contact 23.

In the present embodiment, the conductive film 233 high in thermal resistance is formed at the bottom of the contact 23. Therefore, even if formation of the stacked body 32 and the memory films 42 causes a high temperature state, the conductive film 233 prevents the impurity included in the source layer 14 and the drain layer 15 from diffusing into the metal film 231. Thereby, the contact 23 can be held at low resistance.

First Modification

Figure 8:
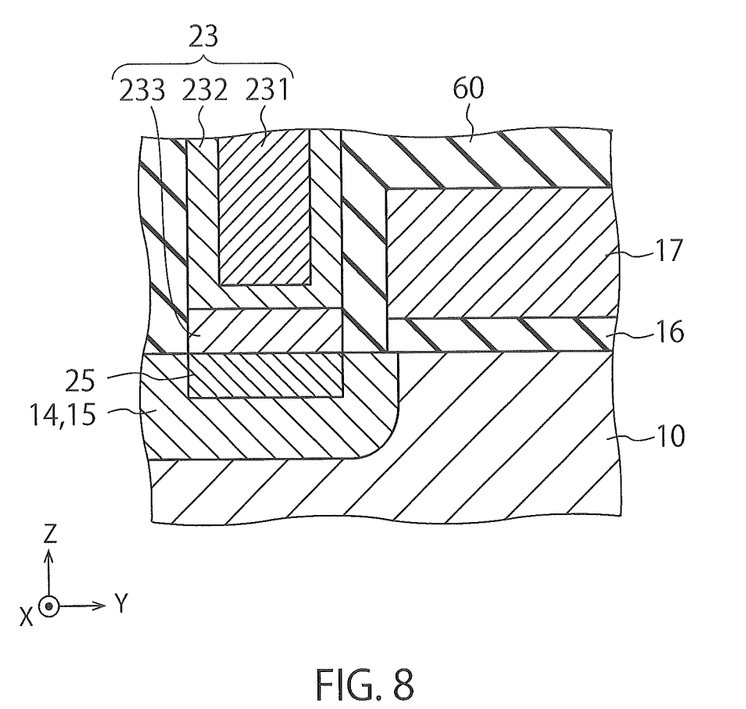
FIG. 8 is a cross sectional view having the essential part of a semiconductor device according to a first modification expanded.

FIG. 8 is a cross sectional view having the essential part of a semiconductor device according to a first modification expanded. The similar components to those in the first embodiment above are given the same signs and their detailed description is omitted.

In the present modification, as shown in FIG. 8, a silicide film 25 is formed between the conductive film 233 and the source layer 14 (or the rain layer 15). The silicide film 25 is composed, for example, of a compound of tungsten and silicon.

Similarly to the first embodiment, also in the present modification, the hole 70 is formed in order to form the contact 23. Since this results in exposure of a surface of the semiconductor substrate 10 from the hole 70, the surface is occasionally oxidized, resulting in formation of a silicon oxide film. There possibly arises a case where electric connection between the source layer 14 (or the drain layer 15) and the contact 23 cannot be secured since the silicon oxide film is an insulating film.

Therefore, in the present embodiment, after the source layer 14 (or the drain layer 15) is formed, metal such as tungsten and silicon included in the semiconductor substrate 10 are caused to undergo a chemical reaction to form the silicide film 25 which is a conductive film. Thereby, formation of the aforementioned silicon oxide film can be prevented.

After the formation of the silicide film 25, the conductive film 233 is subsequently formed on the silicide film 25. After that, similarly to the first embodiment, the barrier metal film 232 and the metal film 231 are sequentially formed.

According to the present modification described above, electric connection between the source layer 14 (or the drain layer 15) and the contact 23 can be secured by means of the silicide film 25.

Second Modification

Figure 9:
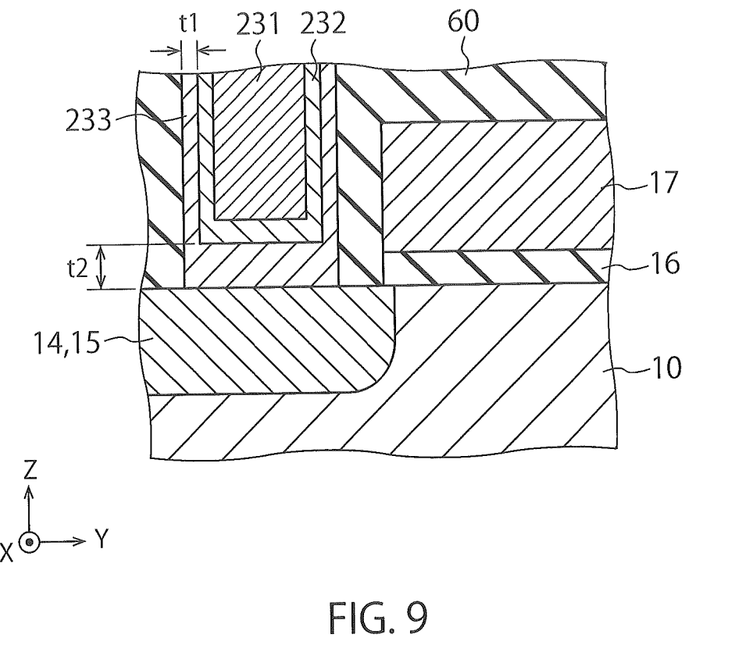
FIG. 9 is a cross sectional view having the essential part of a semiconductor device according to a second modification expanded.

FIG. 9 is a cross sectional view having the essential part of a semiconductor device according to a second modification expanded. The similar components to those in the aforementioned first embodiment are given the same signs and their detailed description is omitted.

In the present modification, as shown in FIG. 9, the conductive film 233 is in contact not only with the bottom surface of the barrier metal film 232 but also with the lateral surface thereof. It should be noted that a thickness "t1" of the conductive film 233 that is in contact with the lateral surface of the barrier metal film 232 is smaller than a thickness "t2" of the conductive film 233 that is in contact with the bottom surface of the barrier metal film 232.

While in the first embodiment mentioned above, the conductive film 233 is deposited in the hole 70 by sputtering, the film deposition method of the conductive film 233 is not limited to sputtering but may be CVD or ALD, for example. When the conductive film 233 is formed by CVD or ALD, the conductive film 233 is possibly formed not only in the bottom part of the hole 70 but also on the lateral surface thereof.

When the conductive film 233 that is formed on the lateral surface of the hole 70 is too thick, the resistance of the contact 23 results in being high. Therefore, in the present modification, the resistance of the contact 23 is restrained from rising, by setting the thickness "t1" of the conductive film 233 that is formed on the lateral surface of the hole 70 to be smaller than the thickness "t2" of the conductive film 233 that is formed in the bottom part of the hole 70.

According to the present modification described above, since the barrier metal film 232 is totally covered by the conductive film 233 high in thermal resistance, the impurity can be more securely prevented from intruding into the metal film 231.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate having a diffusion region including an impurity; and
a contact provided on the diffusion region, wherein the contact includes
a metal film;
a barrier metal film covering the metal film;
a conductive film provided between the barrier metal film and the diffusion region and including a conductive material having a higher heat of formation than a heat of formation of the barrier metal film;
a stacked body which is arranged on the contact and in which electrode films and insulating films are alternately stacked; and
a memory film provided in the stacked body.

2. The semiconductor device of claim 1, wherein
a material of the barrier metal film is titanium nitride, and the conductive material is zirconium nitride or hafnium nitride.

3. The semiconductor device of claim 1, further comprising a silicide film provided between the conductive film and the diffusion region.

4. The semiconductor device of claim 1, wherein the conductive film is in contact with a bottom surface and a lateral surface of the barrier metal film, and a thickness of the conductive film that is in contact with the lateral surface is smaller than a thickness of the conductive film that is in contact with the bottom surface.

5. A manufacturing method of a semiconductor device, comprising:
firming a hole penetrating an interlayer insulating film covering a semiconductor substrate;
firming a diffusion region including an impurity on a surface, of the semiconductor substrate, that is exposed from the hole;
forming a contact in the hole, the contact including a metal film, a barrier metal film covering the metal film, and a conductive film provided between the barrier metal film and the diffusion region and including a conductive material having a higher heat of formation than a heat of formation of the barrier metal film;
forming a stacked body in which electrode films and insulating films are alternately stacked on the contact; and
forming a memory film in the stacked body.

6. The method of claim 5, comprising forming the conductive film in a bottom part of the hole using sputtering.

7. The method of claim 5, wherein
a material of the barrier metal film is titanium nitride, and the conductive material is zirconium nitride or hafnium nitride.

8. The method of claim 5, comprising forming a silicide film between the conductive film and the diffusion region.

9. The method of claim 5, wherein the conductive film is formed on a bottom surface and a lateral surface of the harrier metal film, and a thickness of the conductive film that is formed on the lateral surface is smaller than a thickness of the conductive film that is formed on the bottom surface.

\* \* \* \* \*